United States Patent [19]
Mori et al.

[11] Patent Number: 5,320,551
[45] Date of Patent: Jun. 14, 1994

[54] SOCKET

[75] Inventors: Ikuo Mori, Gotenba; Kiyokazu Ikeya, Shizuoka, both of Japan

[73] Assignee: Texas Instruments Incorporated, Dallas, Tex.

[21] Appl. No.: 937,627

[22] Filed: Aug. 28, 1992

[30] Foreign Application Priority Data

Sep. 18, 1991 [JP] Japan .................... 3-267289

[51] Int. Cl.⁵ .......................................... H01R 11/22
[52] U.S. Cl. ..................... 439/266; 439/330
[58] Field of Search ............... 439/259-269, 439/330, 331, 68-73

[56] References Cited

U.S. PATENT DOCUMENTS

| | | | |
|---|---|---|---|
| 4,547,031 | 10/1985 | Korsunsky | 439/73 |
| 4,676,571 | 6/1987 | Petersen et al. | 439/261 |
| 4,710,134 | 12/1987 | Korsunsky | 439/264 |
| 4,715,823 | 12/1987 | Ezura et al. | 439/269 |
| 4,750,890 | 6/1988 | Dube et al. | 439/330 |
| 4,789,345 | 12/1988 | Carter | 439/330 |
| 4,801,273 | 1/1989 | Ikeya et al. | 439/269 |
| 4,993,955 | 2/1991 | Savant | 439/331 |
| 5,020,998 | 6/1991 | Ikeya et al. | 439/73 |
| 5,108,302 | 4/1992 | Pfaff | 439/266 |
| 5,147,212 | 9/1992 | Uratsuji et al. | 439/266 |

FOREIGN PATENT DOCUMENTS

| | | |
|---|---|---|
| 0158432 | 10/1985 | European Pat. Off. |
| 0446014 | 9/1991 | European Pat. Off. |

*Primary Examiner*—Larry I. Schwartz
*Assistant Examiner*—Hien D. Vu
*Attorney, Agent, or Firm*—Russell E. Baumann; Richard L. Donaldson; Rene' E. Grossman

[57] ABSTRACT

A socket with a base and a reciprocating cover for use in the burn-in test of an electrical part which is characterized in that during the time from immediately before mounting of the electrical part to the completion of mounting thereof, the electrical part is moved in such a manner that a terminal lead of the electrical part will come in contact and wipe a contact element of the socket so that any oxide film on the surface of the contact element of socket is removed. Also, a latch can be provided for holding the socket in desired mounting position during the above described wiping and contacting procedure.

7 Claims, 13 Drawing Sheets

SOCKET

BACKGROUND OF THE INVENTION

This invention relates to a socket having a contact element which in connection with the insertion and installation of an IC package with a prescribed electrical part and IC chip is electrically contacted with this electrical part.

In recent years, the IC package has become thin and small thereby making it more suitable for surface mounting. As the IC becomes thinner and smaller, the quality of the product and any test to determine defective products assumes as important a role as ever.

The testing of the IC packages including the IC for surface mounting typically uses a burn-in test for heat resistance which is carried out by putting the IC package in a heating furnace. A prior art socket for IC package mounting in such a test is shown in FIG. 25.

As shown in an expanded plane view in FIG. 21, an expanded front view in FIG. 22 and an expanded back view in FIG. 23, the IC package 10 has a lead 10b only on one side of the IC chip to be vertically mounted on a printed substrate in a so-called vertical surface mount package (VPAK) type. Protrusions 10a are provided at both ends of the side where the lead 10b of the IC package is provided, with tips 10c of the leads being bent by approximately 90 degrees. FIG. 24 is an expanded cross-section cut along line 24—24 in FIG. 22 which shows this feature. The IC package 10 is mounted vertically on the printed substrate 50 which is indicated by an imaginary line. In this state of mounting, the protrusions 10a are inserted into blind holes 50a of the printed substrate 50, with the result that the IC package 10 is positioned relative to the printed substrate 50 and the bent tip 10c of the lead 10b is soldered to the wiring 50b of the printed substrate 50.

In connection with a burn-in test, however, the IC package 10 is mounted horizontally on the socket as shown in FIG. 25. FIG. 25 shows an expanded cross-section of a socket with the IC package having been mounted. The socket comprises a main socket body or base 41 equipped with a contact 43 and a cover 42. The cover is biased open by a coil spring 45 and is stopped at a prescribed location as compared with the base by a "stop" mechanism which is not shown in the drawings.

The charging of IC package 10 is done by inserting the package into space 41a placing it on the surface 41c of the stand 41b. The contact 43 has its basal part 43a buried in the bottom wall of the base 41 and a terminal part 41e that protrudes from the bottom of the base 41. A pin part 43b is attached to the base part 43a and has a curved part extending into a space in the base but further with a tip portion 43c and tip end 43d. Due to the elasticity of pin part 43c, the tip 43d of the tip part 43c compressively contacts the curved tip portion 10c of the lead 10b upon the insertion of the IC package 10 thereby providing electrical contact between lead 10b and contact 43.

As shown in FIG. 26, the electrical connection between lead 10b and contact 43 is made certain by the use of a sharp contact tip end 43d which bites into the tin plated layer through the oxidized coating 10f on the surface of the tin plated layer. If tip end 43d bites through the tin plated layer 10e of the lead 10b in the core material 10d (nickel or copper), good electrical connection is still maintained. The reason for this good electrical connection lies in minimizing the contact resistance due to the oxide coating 10f that is inevitably produced on the surface of the tin plated layer by biting through the oxide layer. This socket, however, of the aforementioned construction still has the following problems:

(i) The surface of the contact is often plated with gold, etc., for low contact resistance and good corrosion resistance and the tin on the surface of the lead adheres to the surface of the plated layer on the contact surface during connection of the contact and lead. As a consequence of this fact, the contact resistance increases at the time of a burn-in test and the reliability of the test will then drop.

(ii) Since the lead is only on one side of the IC package, the IC package tends to jump upward as it is pushed by the contact.

(iii) In view of the fact that the contact is arranged outside as compared with the IC package, the width of the socket becomes greater by the width of the contact, with a result that the density of the mounting on the printed substrate for test in the case of a large number of sockets with the IC package mounted drops at the time of a burn-in test. Because of this fact, there is a decrease in the number of IC packages that can be tested at one time, thereby bringing about inefficiency.

The aforementioned problem (i) similarly exists in the case of the IC package with the leads being provided on a plurality of sides such as the IC package of the type where leads are provided on the mutually opposed sides in addition to the IC package of the VPAK type.

SUMMARY OF THE INVENTION

A socket with a reciprocating motion member according to this invention is constructed in such a way that during the time from immediately before the mounting of an electrical part to the completion of mounting thereof, the electrical part is moved in such a manner that a connective terminal lead of the electrical part will come in contact and wipe a contact element of the socket in a direction along the direction of the reciprocating movement of the reciprocating member. This wiping action removes the oxide film that is produced on the surface of the contact element of the socket. Additionally, the oxide that has been removed from the connective terminal does not adhere to the contact element and can easily be removed by the next wiping action. As a consequence, the contact resistance is not increased by the presence of the oxide and thus resistance is not increased by the presence of the oxide and thus low contact resistance can be guaranteed at all times.

It is an object of this invention to provide a highly reliable socket which eliminates the problems described above, and in particular, which maintains a low contact resistance at all times.

Briefly described, the socket of this invention comprises a socket for mounting an electrical part having a main socket body, a contact element which is adapted to be electrically connected in an elastically compressed state to a contact terminal of said electrical part when mounted in said socket, a reciprocating motion member capable of reciprocating motion in respect to said main socket body, linkage means for linking motion between said reciprocating motion member and said contact element such that as said reciprocating motion member moves from a first original position to a second position for mounting said electrical part said contact element also moves from a first original position to a second electrical part mounting position and upon said reciprocating motion member returning to said original position from said second position said contact element also moves back to said original position from said second position in which contact is made in this original position between said contact element and said contact terminal of said electrical part and means to cause said contact terminal to contact and wipe the contact element prior to said contact element moving to original position so as to remove any oxide film on said contact element.

In another aspect of the present invention, the socket provides for a latch means to hold the electrical part in place during contacting between a contact element of the socket and a contact terminal of the electrical part.

DESCRIPTION OF THE DRAWINGS

Other objects, advantages and details of the socket of this invention appear in the following detailed description of preferred embodiments of the invention, the detailed description referring to the drawings in which:

FIG. 7 is an expanded front view of the socket of the present invention;

DETAILED DESCRIPTION OF THE PREFERRED EMBODIMENT

Figure 1:
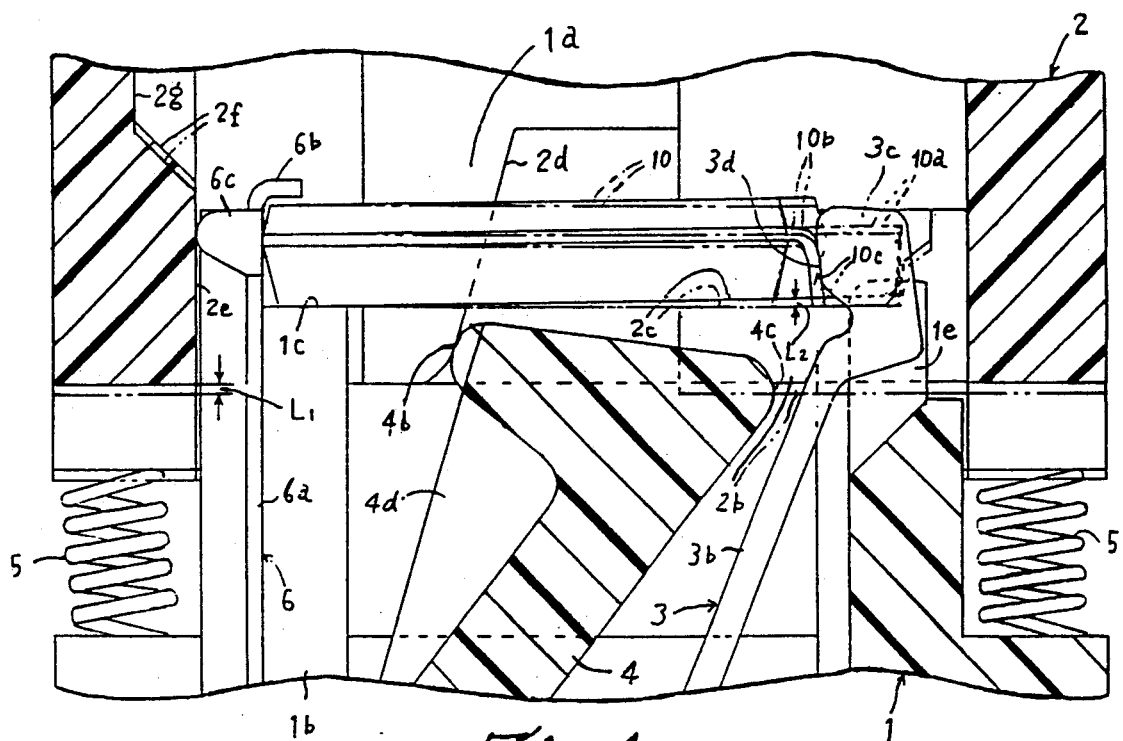
FIG. 1 is an expanded partial cross-section of a socket of the present invention (Example 1) showing the state immediately before the IC package mounting and at the completion of said mounting.
Figure 2:
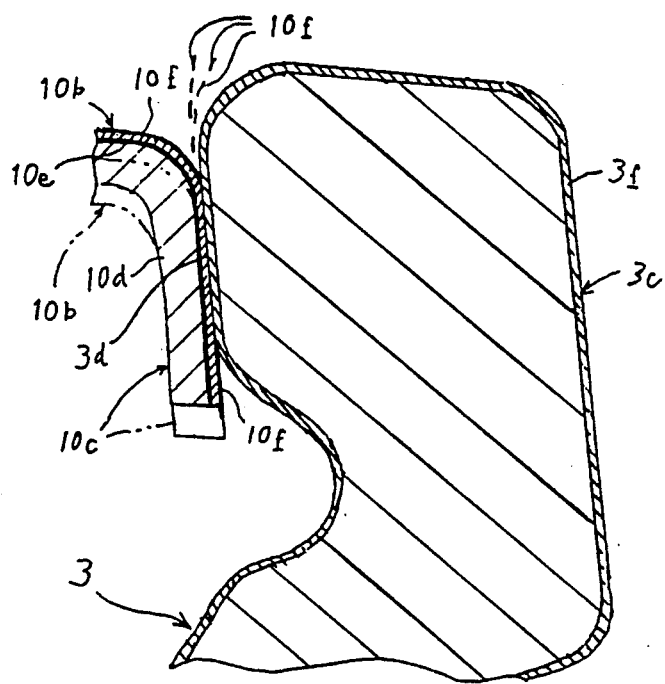
FIG. 2 is an expanded partial cross-section of FIG. 1.

This invention will be described by referring to the drawings showing the embodiments (Examples 1-4). Embodiments 1 and 2 are examples of a socket for the burn-in test where the IC package of the VPAK type is mounted.

Figure 8:
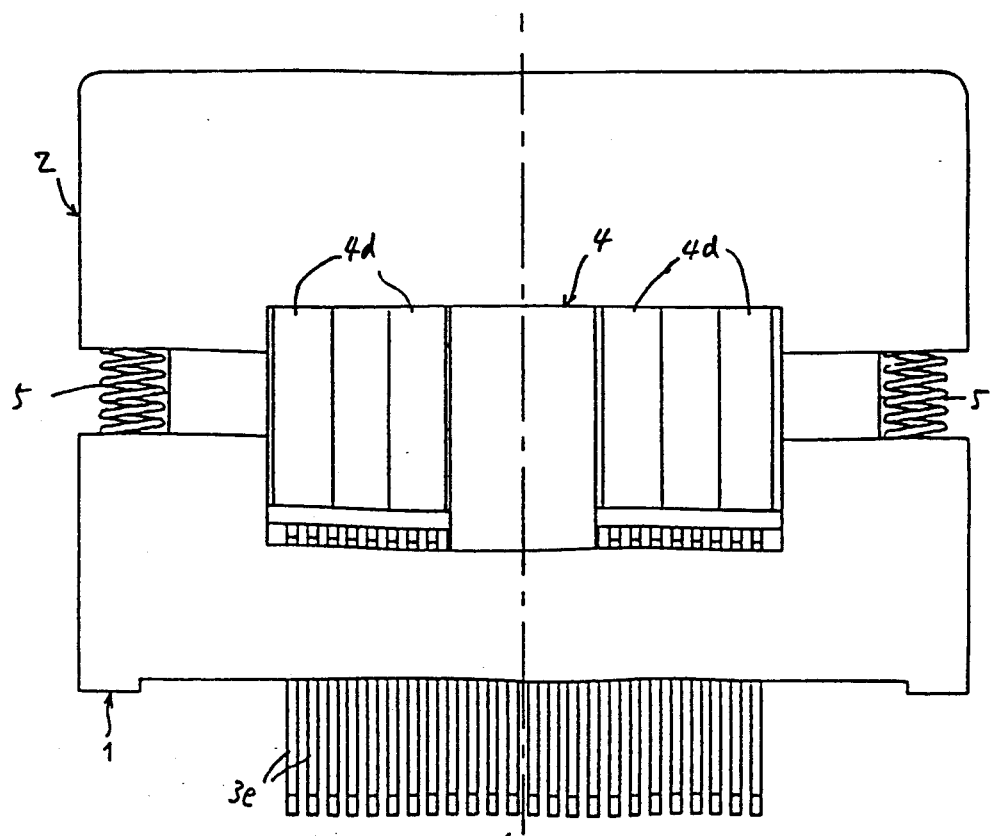
FIG. 8 is an expanded left-side view of the socket of the present invention.
Figure 9:
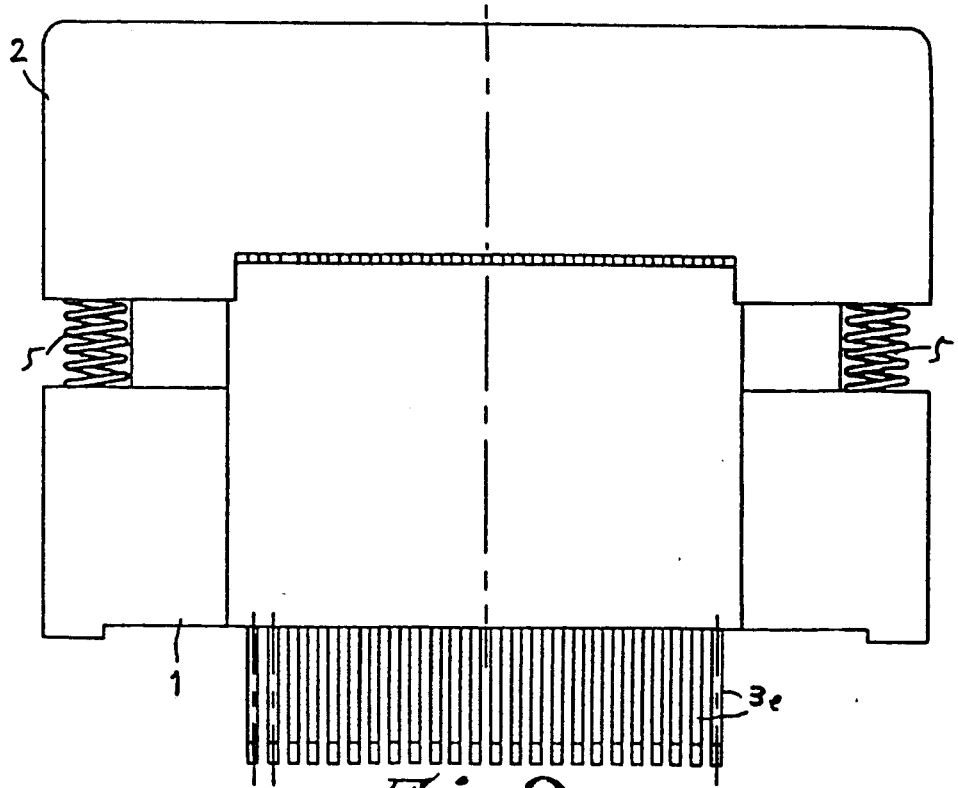
FIG. 9 is an expanded right side view of the socket of the present invention.
Figure 10:
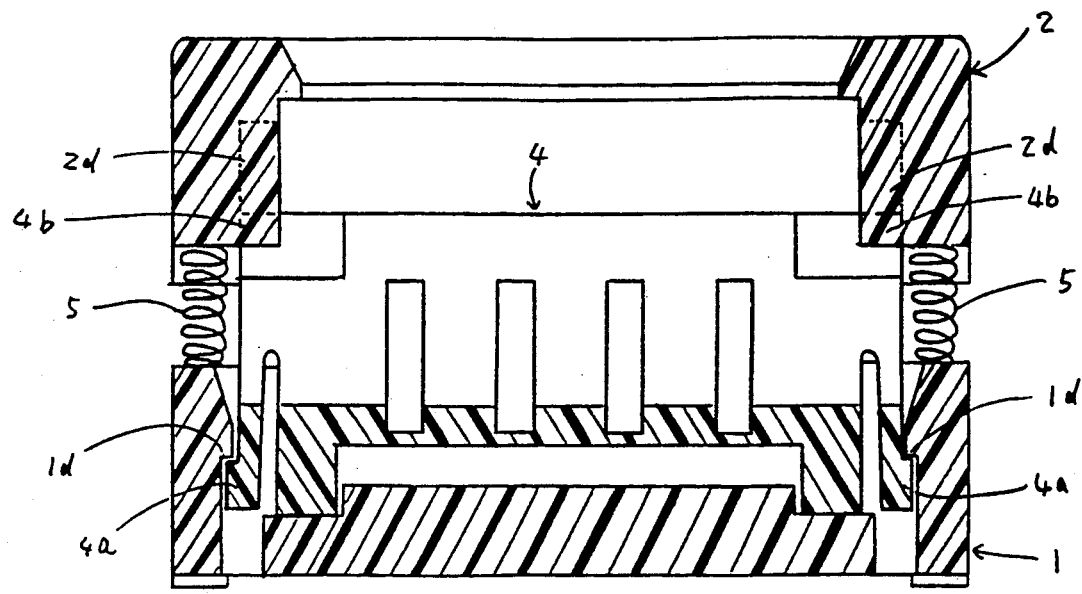
FIG. 10 is a cross-section cut along lines 10—10 in FIG. 6.
Figure 11:
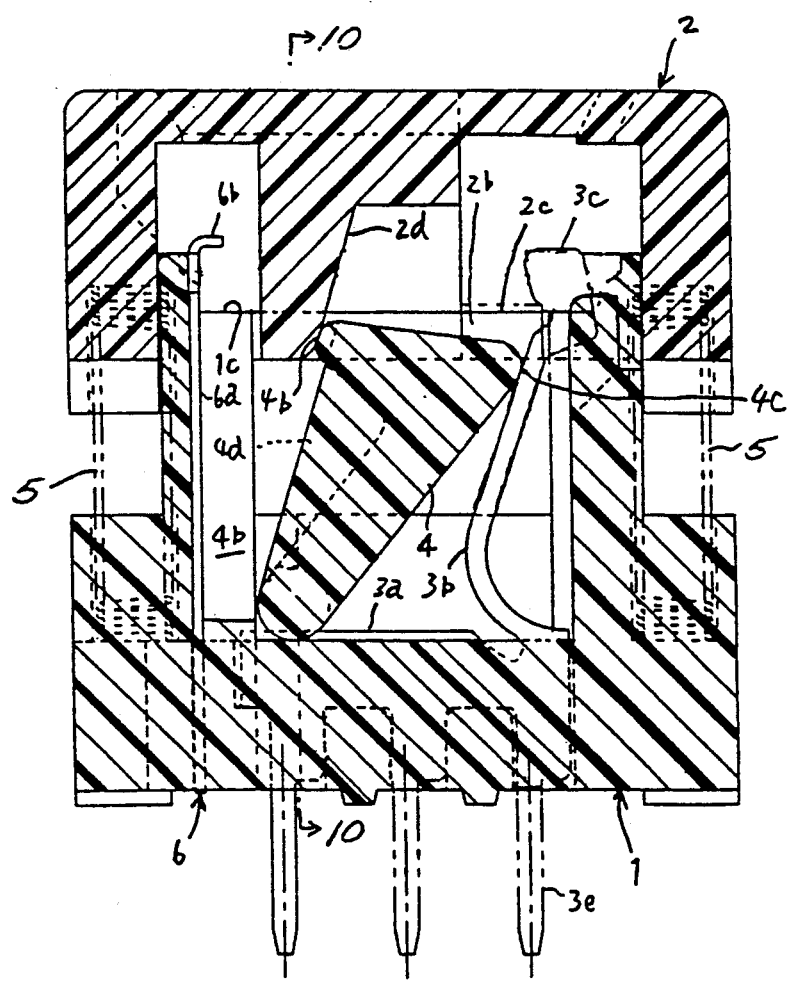
FIG. 11 is a cross-section cut along line 11—11 in FIG. 6.
Figure 12:
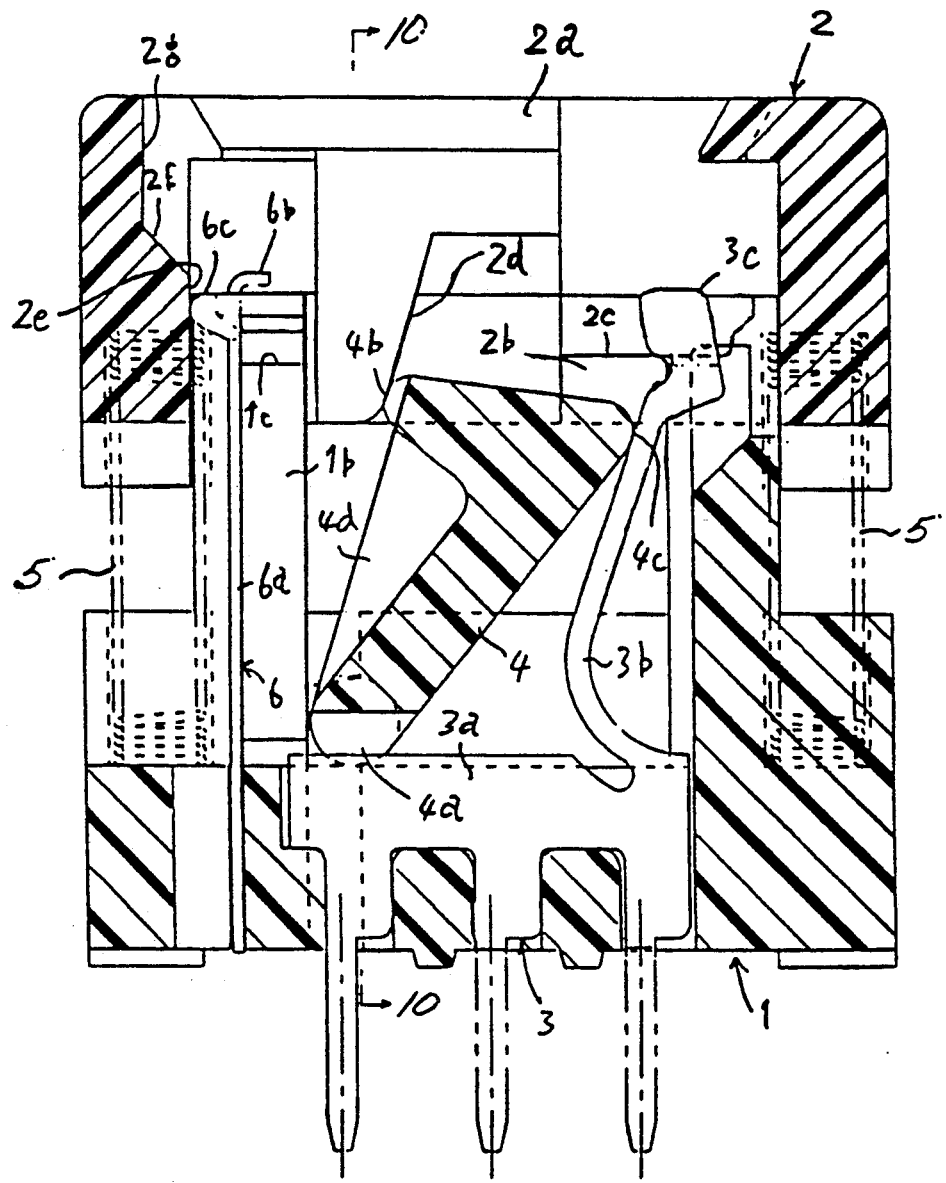
FIG. 12 is a cross-section cut along line 12—12 in FIG. 6.

The first embodiment is as shown in FIGS. 6–12, with FIGS. 8 and 9 having a smaller rate of expansion than the other figures. At the center of the bottom wall of the base 1, a base part 3a of contact 3 is buried in the base 1 with a terminal portion 3e extending out of base 1 from base part 3a and a pin part 3b extends upwards out of the base into a base space. The pin part 3b is biased to the left as shown in FIGS. 11 and 12 by its spring properties and configuration. A cam 4 which is journaled by the axial parts 4a on both sides of the base 1 is located in the space of the base and a contact surface 4c contacts pin part 3b.

On a side of cam 4 are a plurality of concave portions 4d of wide and substantial depth of the same general thickness for the purpose of preventing the development of whiskers at the time of forming. Axial part 4a has at its tip a small-thickness portion for insertion into an axial insertion opening 1d that has been provided on the side wall of the base. On both sides of the cam 4 there are provided contact surfaces.

On the base 1, a cover 2 is biased in a direction which is opposite to the base by coil springs 5 and the cover 2 is positioned at a prescribed location as compared with the base 1 in its at rest location by a stopper mechanism not shown in the drawings. On both sides of the cover 2 are first included surfaces 2d formed therein in which contact surfaces 4b of the cam 4 are in contact.

The base 1, the cover 2 and the cam 4 are typically made of polyether imide or polyether sulfide resin and the contact is made from a resilient material such as beryllium copper.

At a position on the side opposite to the contact pin part 3b on the bottom wall of the base 1, is a latch 6 for holding the IC package having a spring plate 6a, with a curved lip 6b and a contact portion 6c. The end terminal part of the spring plate 6a is fixed to base 1. The curved lip portion 6b at the other end of the spring plate is bent by approximately 90 degrees and immediately below it a contact portion 6c is fixed and the contact portion 6c contacts the inner surface 2e of the side wall of the cover 2 by the elasticity of the spring plate 6a.

Figure 3:
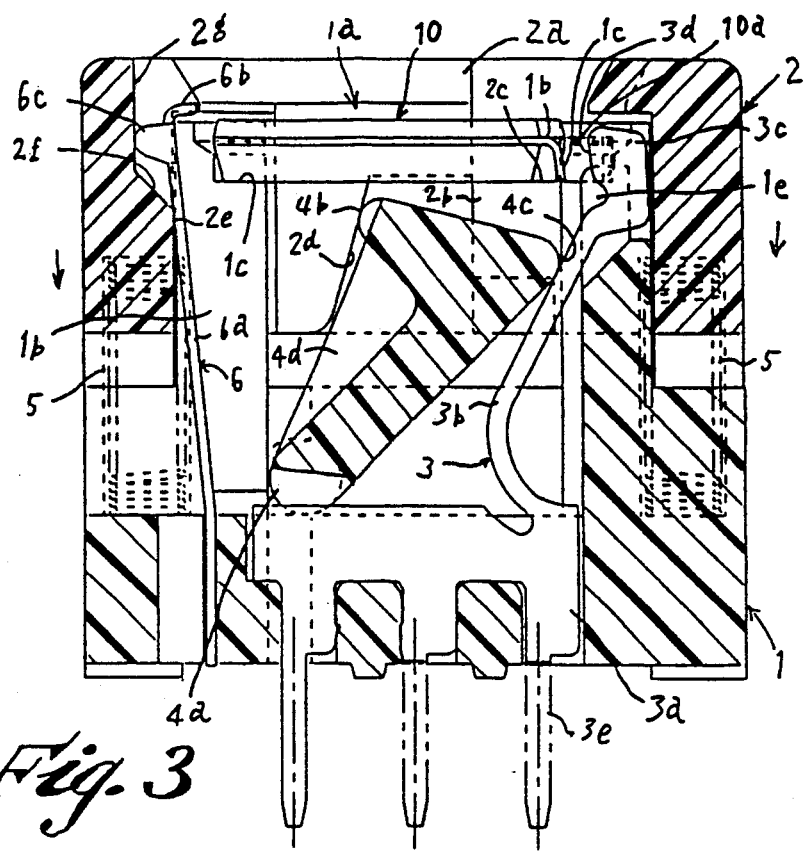
FIG. 3 is an expanded cross-section of the socket of FIG. 1 in the state of the IC package being inserted with the cover being lowered.
Figure 4:
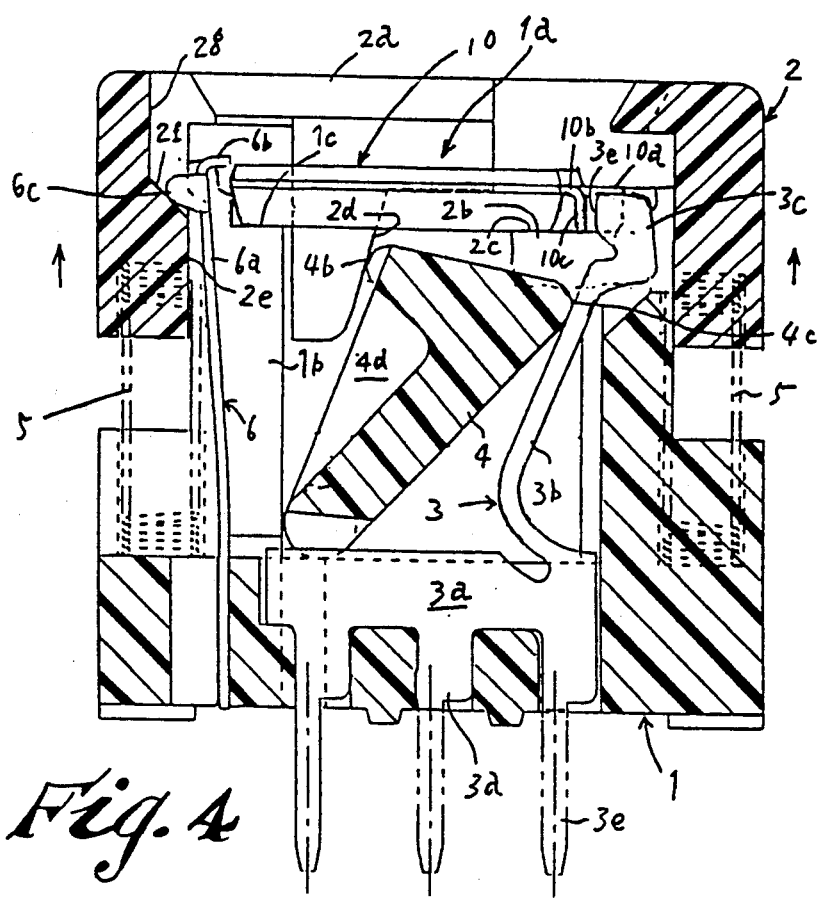
FIG. 4 is an expanded cross-section of the socket of FIG. 1 in the state where the cover is rising.
Figure 5:
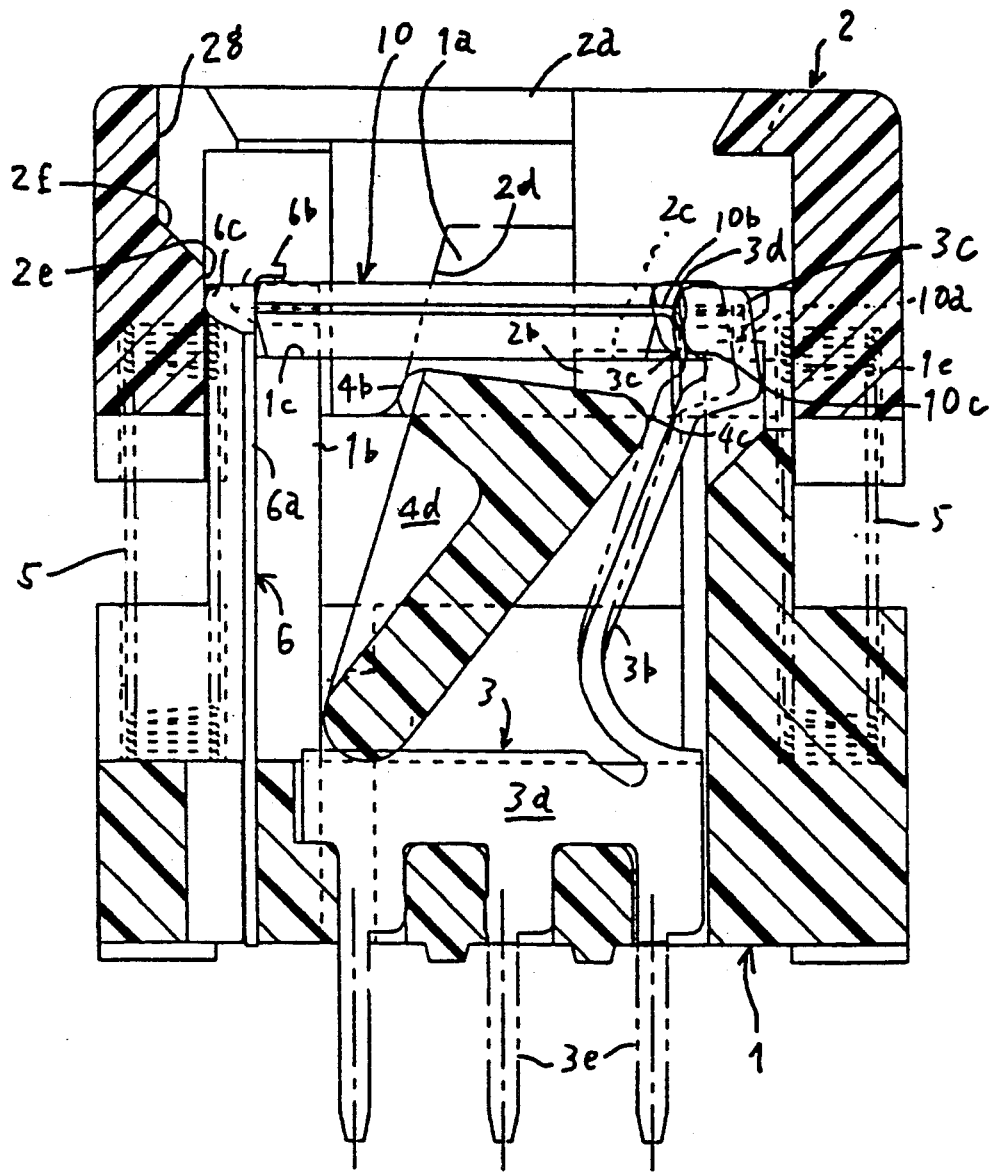
FIG. 5 is an expanded cross-section of the socket of FIG. 1 in the state of mounting of the IC package having been completed.
Figure 6:
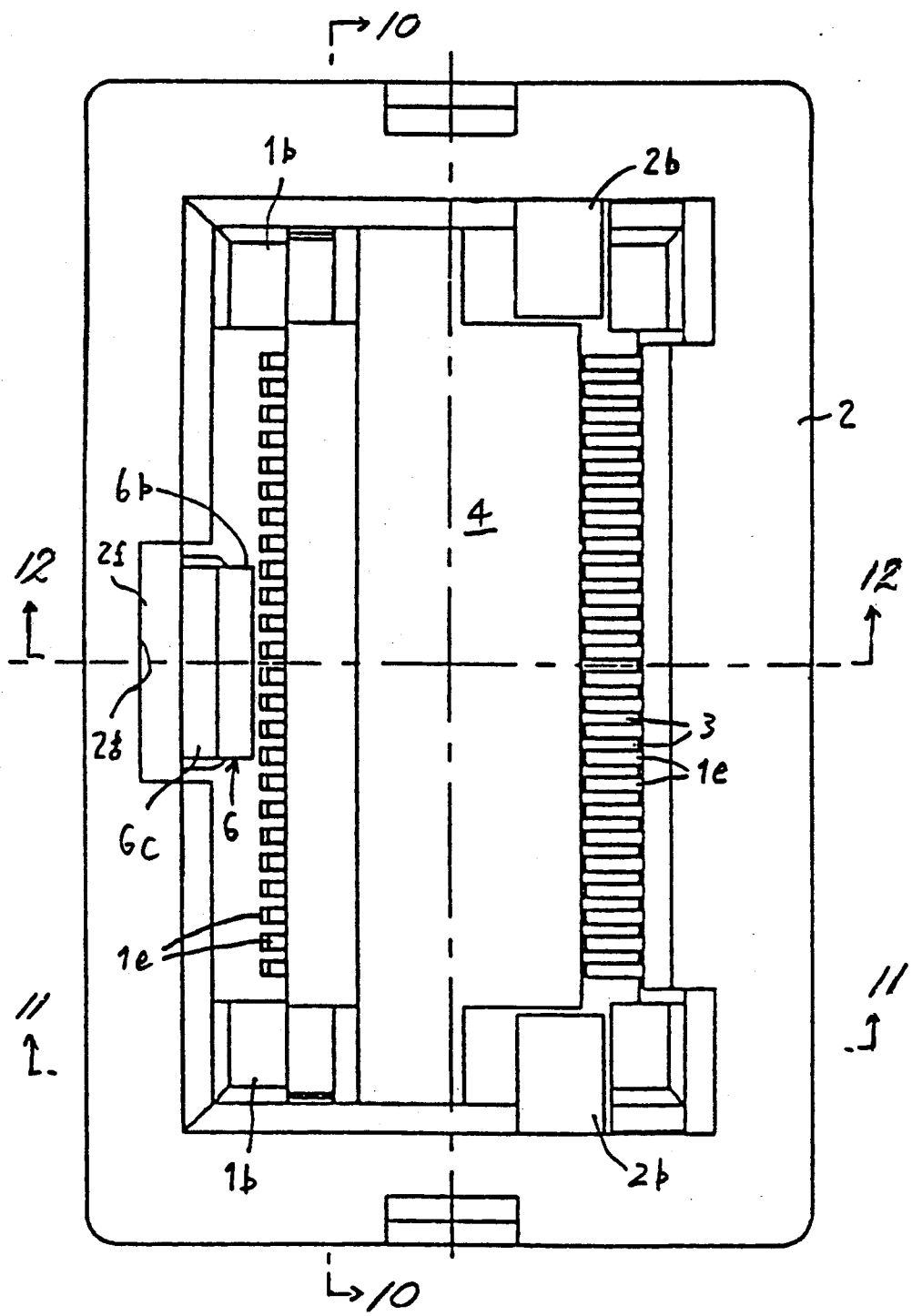
FIG. 6 is a plane view of the socket of the present invention.
Figure 2:
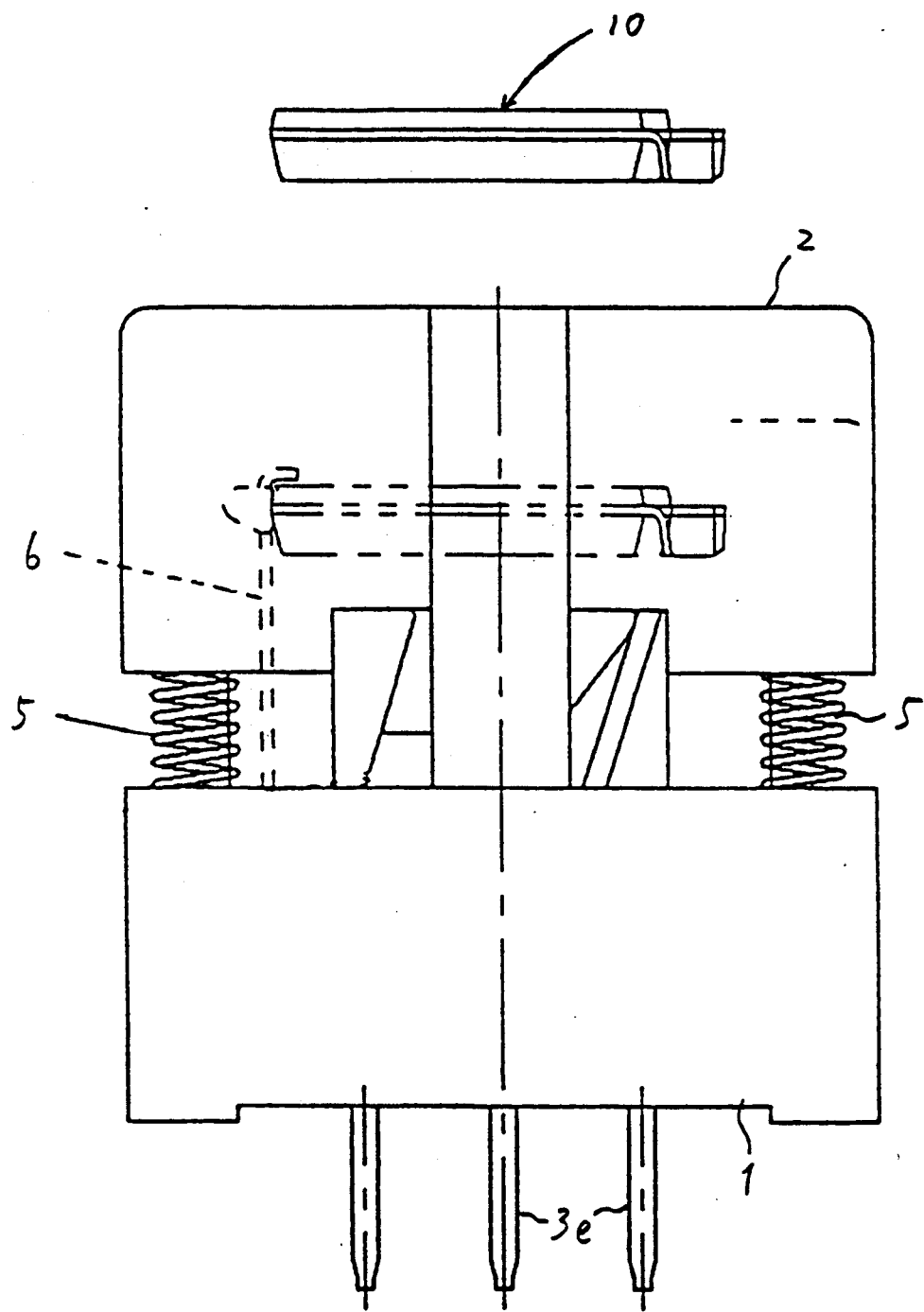

The mounting of the IC package to the socket and means for this mounting will be explained by specifically referring to FIGS. 1 and FIGS. 3 through 5. FIG. 5 is an expanded cross-section of the socket with an IC package being mounted. FIG. 3 is an expanded cross-section of the state of the IC package being inserted into the socket and FIG. 4 is an expanded cross-section of the state leading from the state shown in FIG. 3 to the state shown in FIG. 5.

FIG. 1 is a further expanded cross-section showing the state immediately before the IC package is mounted and the completion of said mounting. The cross-section view in these figures is the position of line 12—12 in FIG. 6.

As shown in FIG. 3, the cover or reciprocating member 2 is pushed down toward the base 1. During the movement of the cover the contact piece 6a of latch 6 engages an inner surface 2g of the thin part of the top of the second inclined surface 2f that is provided on the side wall of the cover. Simultaneously with the above, a first inclined surface 2d of the cover comes down and contacts the first contact surface 4b of the cam 4 and causes the cam 4 to rotate in a clockwise direction with axial part 4a as the center of rotation. Due to this rotation, pin part 3b of the contact is pushed to the right (FIG. 3) by the second contact surface 4c and tip part 3c of the contact is also moved to the right. By this movement, the latch 6 and contact 3 open up an area 1a for insertion of the IC package.

In this state, the IC package 10 is inserted into accommodating space 1a of base 1 via the opening 12a of cover. The IC package 10 which has been charged is placed on a placing surface 1c of a stand 1b on the left side of base 1 and on a placing surface 2c of a placing stand 2b on the right side of cover 2. On the placing surface 2c of the cover, the side of protrusion 10a of the IC package is placed.

When the push-down force of the cover is released, the cover 2 rises due to coil springs 5 and returns to its original position. FIG. 4 shows the cover intermediate this return. In the stage where the cover rises, the contact piece 6c of latch 6 touches the second inclined surface 2f of the cover and shifts toward the IC package 10. Simultaneous with this action, the first inclined surface 2d of the cover rises and, as the first contact surface 4b which is in contact with surface 2d attempts to be restored to the left, the cam 4 rotates in a counter clockwise direction with a consequence that contact pin part 3b in contact with cam surface 4c moves toward the IC package 10.

Finally, the contact piece 6c of latch 6 contacts the inner surface 2e on the side wall of the cover (FIG. 5). In this state, the curved tip part 6b is positioned directly above the left-side edge of IC package 10, thereby preventing the left-side edge of package 10 from moving up. Thereafter, the cam 4 is completely restored to its original position and the contact pin part 3b gets separated from the second contact surface 4c of the cam and, by the elasticity of the pin part 3b, the tip 3c of the contact compressively engages a curved portion 10c of the lead.

The pin part 3b and the tip part 3c of the contact are made to move through a gap amongst a large number of thin guide walls 1c which are provided on base 1 so that the tip part 3c can accurately contact the curved lead portion 10c.

Since the side edge of the IC package 10 is located below the curved tip 6b of the latch (with a small gap between the latch and the IC), it does not jump out in spite of the lead compressive pressure by the tip part 3c of the contact. In this example, the base part of contact 3a is fixed to the bottom wall of base 1 at a position which is immediately below the IC package 10, with a favorable consequence that the width dimension of the socket as a whole is small and the mounting density at the time of a burn-in test can be large.

What should be noted especially in this example is the fact that the bent part of the lead of the IC package wipes the contact surface immediately after the contact 3d has contacted the bent part of the IC package. This feature will be explained further below with reference to FIG. 1, which is a partly expanded view of FIG. 5. FIG. 1 also shows the state immediately before arriving at the state shown in FIG. 5 by using imaginary lines.

In the stage leading from the state shown by the imaginary lines to the state shown by the solid line, the placing surface 2c of cover 2 rises from the position indicated by the imaginary line to the position indicated by the solid line. The dimension of this elevation is L1. Because of this elevation of the cover 2, the IC package 10 rises from the position shown by the imaginary line to the position shown by the solid line by the dimension of L2.

Because of this elevation, the surface of the lead bend part 10c of the IC package will wipe the contact surface 3d of the tip 3c of the contact. As a result of this, the oxide film 10f of tin existing on the outermost surface of the lead bent part 10c is peeled off as it slides on the contact surface 3d.

Accordingly, the contact surface 3d of the contact directly contacts the tin-plated layer 10e of the lead bent part in a compressed state, with a result that there is no possibility for the contact resistance to increase at the time of a burn-in test. In addition, since the oxide film of the tin does not adhere to the contact tip 3c and since, even if it adheres to the contact tip 3c, it can be peeled off by the next wiping, it is a fact that there is no reason whatsoever for the contact resistance to be increased in the subsequent burn-in test after the completion of the initial burn-in test.

The second embodiment (Example 2) covers a socket for the burn-in test in which the IC package can be turned over upside down, with either the front or the back being capable of IC package mounting.

Figure 13:
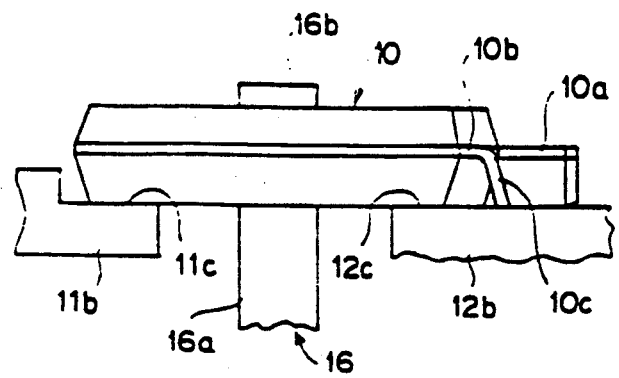
FIG. 13 is an expanded cross-section of an essential part of the second embodiment of a socket of the present invention (Example 2) with IC package.
Figure 16:
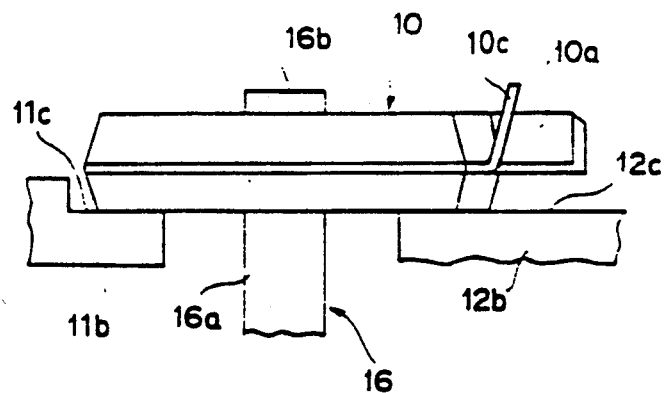
FIG. 16 is an expanded cross-section of the essential part of the socket of FIG. 13 with the IC package being mounted upside down.

FIG. 13 is an expanded view of the essential part of the socket with the IC package mounting as in the case of the aforementioned first embodiment (Example 1) and FIG. 16 is an expanded view of the essential part of the socket with the IC socket being mounted upside down.

Figure 14:
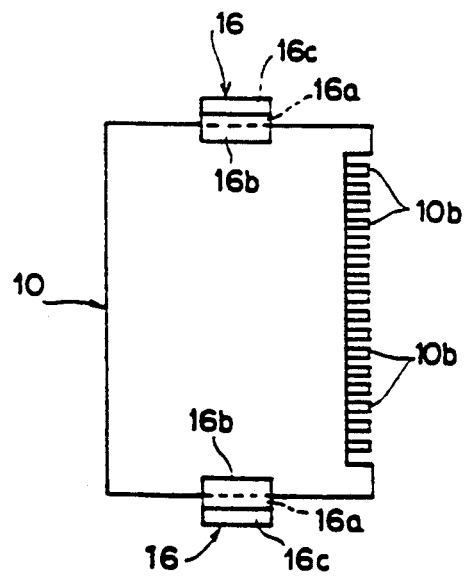
FIG. 14 is an expanded plane view of FIG. 13.
Figure 15:
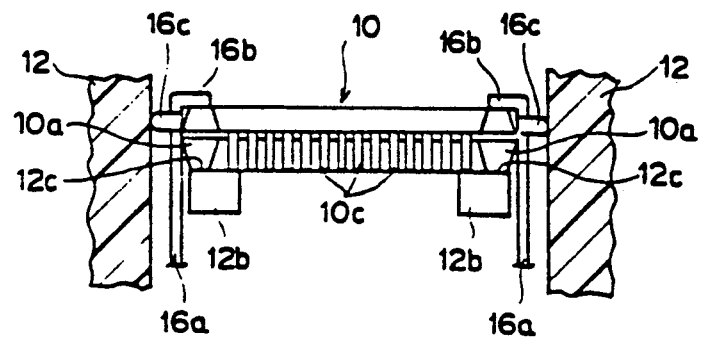
FIG. 15 is an exploded right-side view of FIG. 13.

It is mentioned in this connection that the various parts of the socket are indicated by the same letter codes as shown in FIGS. 1 through 5 and 10 (the same is true of the following FIGS. 14 and 15).

In this Example 2, a latch is provided on the side of the mutually facing two sides which are adjacent to the side where the lead of the IC package has been provided. The reason for this is set forth below.

In the case where the bent lead part 10c is bent to have an obtuse angle (up-side down state as shown in FIG. 16), a contact surface of a contact element of the socket will contact such surface on the lower side at the right of the bent lead part 10c. If the latch 16 is provided at a location on the side which is opposite to the lead a shown in FIGS. 1 through 5, the bent lead part 10c is pushed up with the result that the IC package jumps upward. Because of this jump-out, there is a danger that the socket can be damaged and the lead deformed.

In this Example 2, therefore, a latch 16 is provided on the side of the two mutually opposite sides, adjacent to the side where the lead 10b of the IC package has been provided as shown in FIGS. 13 through 16, thereby preventing the aforementioned trouble. The mechanism of the latch movement and other mechanisms are the same as described in Example 1 above. In this example, an effect which is similar to the effect of Example 1 above is achieved. Additionally, there are two ways of mounting the IC package and it is convenient as there is increased freedom in the method of the burn-in test.

In the next embodiments (Examples 3 and 4), the socket for the burn-in test described is one where the IC package to be mounted has a lead on two mutually opposite sides, i.e., the small outline J (SOJ) lead with each lead being bent in the shape of a J. The IC package of this type is mounted horizontally on the printed substrate, with the result that no protrusion is required and thus none is provided.

Figure 17:
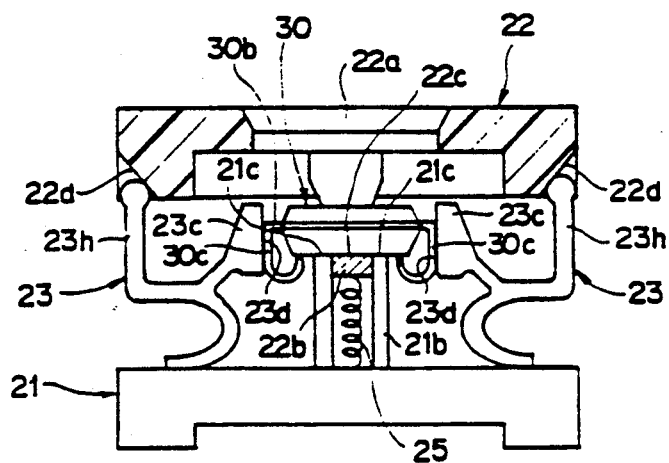
FIG. 17 is an expanded cross-section of an essential part of a third embodiment of a socket of the present invention (Example 3) with IC package.
Figure 18:
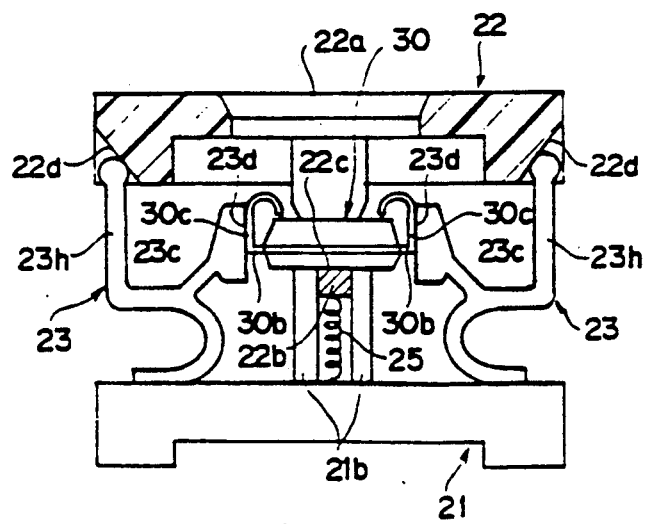
FIG. 18 is an expanded cross-section of the essential part of the socket of FIG. 17 with the IC package being mounted inside out.

FIG. 17 shows an expanded view of the essential part of a socket with an IC package mounted with the lead facing down and FIG. 18 is an expanded view of the essential part of a socket with the lead facing upward. In FIGS. 17 and 18, the various parts of the IC package and the socket are given the same codes as in FIGS. 1 through 5 and 10. Since the lead of each IC package is provided on the right and on the left, the contacts which are made to contact same are also provided in two rows.

A lead 30b of an IC package 30 is bent in the shape of the letter J and the lead parts 30c which are faced downward (FIG. 17) or upward (FIG. 18) are perpendicular to the width direction of the main IC package body.

Accordingly, the vertical lead parts 30c are compressed in the horizontal direction by a tip 23c of contact element 23. As there is no possibility for the IC package to "jump out" because of this compressive force, no latch is provided on the socket.

The IC package 30 is placed on placing surfaces 21 of placing stands 21b of base 21 and the placing surface 22c of placing stand 22b which has been provided on cover 22 located midway between the two placing stands 21b. The cover is biased upward by a coil spring 25 that pushes up the placing stand 22 (in a direction which is opposite to base 21).

A tip part 23c extends from a curved pin part 23b of contact 23. Contact 23 also has a lever portion 23h which extends upward toward the cover with the tip portion of the lever 23h contacting an inclined surface 22d of the cover 22. With this construction the tip parts 23c of contacts 23 increase or decrease the distance between them, and thus position relative to vertical lead parts 30c by the lowering and raising of the cover 22.

In connection with the mounting of the IC package, the cover 22 is first pushed down thereby increasing the distance between contact tips 23c and allowing for the mounting of the IC package 30 on surfaces 21c of placing stands 21b of the base via an opening 22a of cover 22. Upon release from this position, the cover rises back to its original position by force of the coil spring 25 and the additional upward push provided by lever 23h acting on cover surface 22d. Simultaneously with this movement, contact tips 23c move in such a way to narrow the distance between them thereby allowing the vertical parts 30c of the bent leads to be pressed by the contact surface 23d. Upon completion of mounting, the IC package 30 rests solely on the placing surface 22c of placing stand 22b of cover 22, being separated from the placing surface of the base. That is, the package rises slightly as in the case of Example I and the surface of vertical leads 30c wipe contact surfaces 23d. Due to this wiping, the tin oxide on the lead surface is removed and a low contact resistance is guaranteed as in the case of the aforementioned Example 1. Even in this example, the IC package can be mounted with the lead facing either upward or downward.

Figure 19:
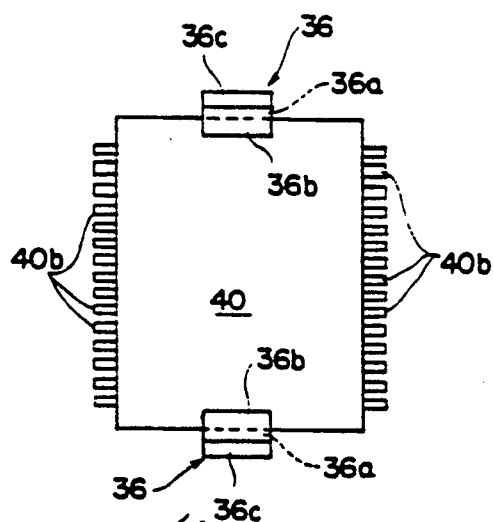
FIG. 19 is an exploded plane view of an essential part of a fourth embodiment of a socket of the present invention (Example 4) with IC package.
Figure 20:
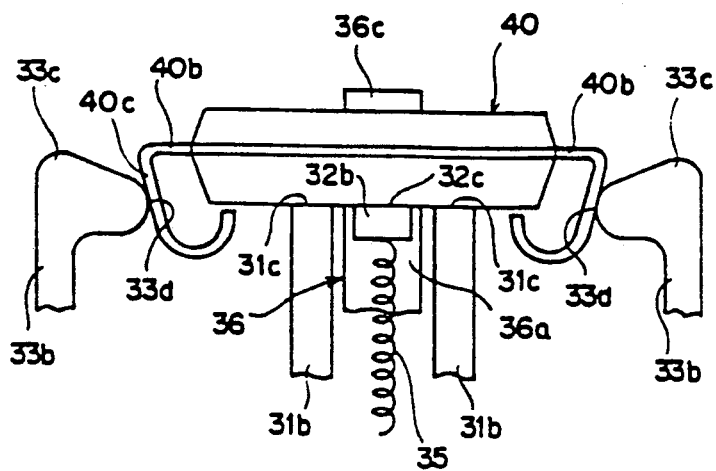
FIG. 20 is an expanded cross-section of FIG. 19.
Figure 21:
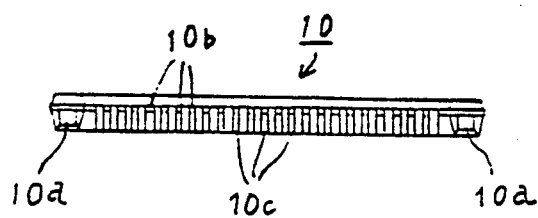
FIG. 21 is an expanded plane figure of the IC package of the VPAK type.
Figure 22:
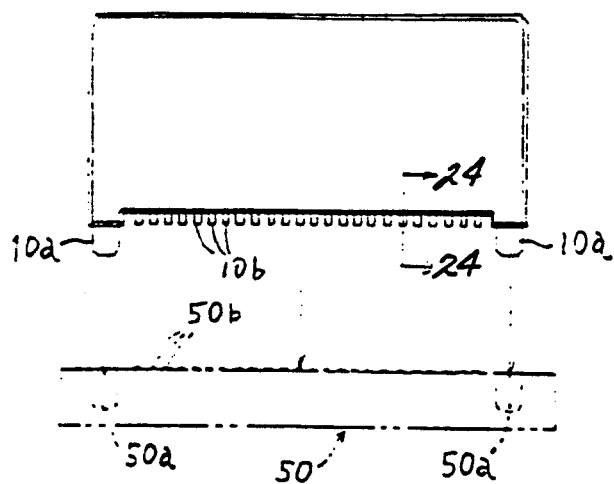
FIG. 22 is an expanded front view of FIG. 21.
Figure 23:
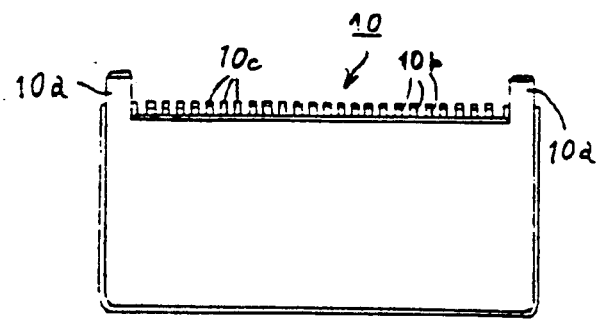
FIG. 23 is an expanded back view of FIG. 21.
Figure 24:
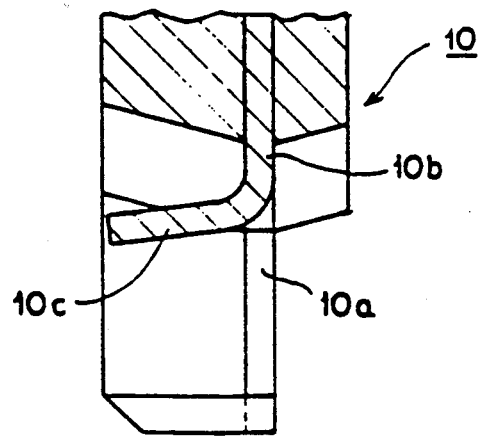
FIG. 24 is an expanded cross-section cut along line 24—24, in FIG. 22.
Figure 25:
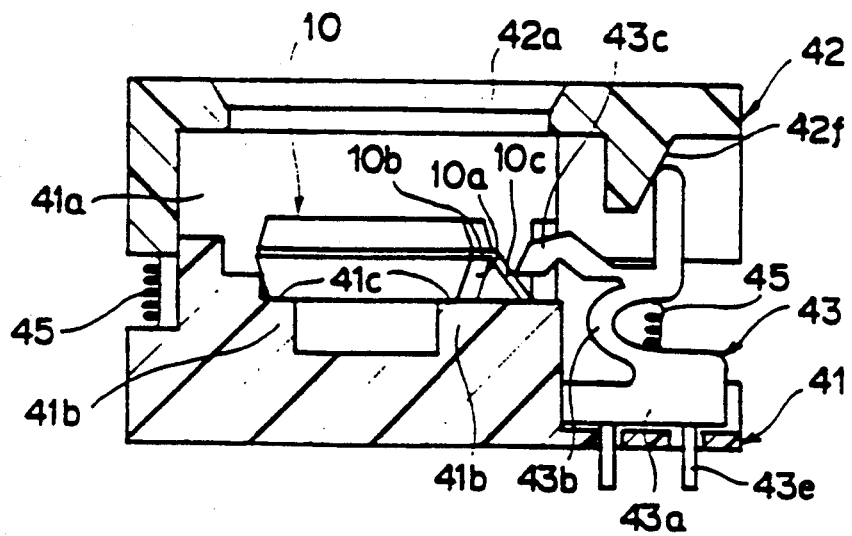
FIG. 25 is an expanded cross-section of the conventional socket with IC package being mounted.
Figure 26:
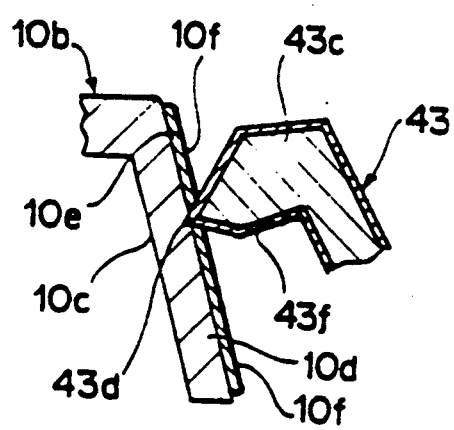
FIG. 26 is an expanded partial cross-section of FIG. 25.

This embodiment (Example 4) is a socket for burn-in test where an IC package of the SOJ type is to be mounted and where the bent lead part of the IC package is not perpendicular to the width direction of the IC package but faces slightly inward. FIG. 19 shows an expanded plane view of the essential part of a socket with an IC package mounted with the leads facing down. FIG. 20 shows an expanded cross-section of FIG. 19. In FIGS. 19 and 20, the various parts of the IC package and the socket are indicated by the codes used in FIGS. 1 through 5 and 10.

As shown in FIG. 20, the tip 33c of a contact 33 compressively contacts a downwardly facing part 40c of a lead 40b of an IC package 40 in the mounted state. Due to this compressive force during contacting, the IC package 40 tends to "jump" upward. In order to prevent this jumping action, a latch 36 is provided on the base for engaging the IC package on two mutually facing sides not containing leads similar to Example 2 above.

Additionally, a placing stand 31b has been provided on the base with a placing surface 21c and a placing stand 32b with a placing surface 32c is provided on the cover between placing stands 31b. Except for the fact that there is a need to face the lead downward during the mounting of the IC package, the other details are the same as mentioned in Example 3 above.

In this example as in the others mentioned above, the lower contact resistance is guaranteed by the fact that, immediately after the contact 33 has contacted the lead 40 of the IC package, the downwardly facing part 30c of the lead wipes the contact surface 33d of the contact 33.

This invention has been explained with reference to the examples stated above. It should be pointed out that said examples can be modified further on the basis of the technical concept of this invention. For example, the shapes, materials and the installation positions of the contact element, cam and base that have been described can be modified in various ways. In addition, the shape, materials, structure of the cover (reciprocating motion member) and the angle of the inclined surface can be changed. Moreover, it is possible to use this socket with IC packages of different shapes and dimensions by using an adaptor. Still further in the above-described examples, the IC package was inserted into the main socket body for mounting purposes by changing the position of the cover in the vertical direction. However, the same can be done by changing it to any suitable direction such as the horizontal direction. The fixing of the IC package and the return of the cover member to its original position may be shifted in terms of timing or may be carried out at the same time.

We claim:

1. A socket for receiving an electrical part with a body portion with a plurality of sides and terminal leads extending from only one of said sides comprising a main body, contact element means mounted on said main body and adapted to make contact with said terminal leads of said electrical part, a reciprocating motion member capable of reciprocating motion in respect to said main body, linkage means for linking motion between said reciprocating motion member and said contact element such that as said reciprocating motion member moves from a first original position to a second position for mounting said electrical part said contact element means also moves from a first original position to a second electrical part mounting position and upon said reciprocal motion member returning to said second position said contact element also moves back to said original position from said second position thereby providing electrical contacting between said terminal leads and said contact element means, means to cause said terminal leads to contact and wipe said contact element means prior to said element means completing movement to said original position so as to remove any oxide film on said contact element means, and noncontact latch means positioned for engaging said electrical part body portion on one of the sides of the electrical part without said terminal leads extending therefrom to prevent excessive movement of the electrical part during the contacting and wiping of said terminal leads with respect to the contact element means.

2. A socket according to claim 1 wherein said latch means is positioned on the side of the electrical part opposite the side having the terminal leads.

3. A socket according to claim 1 wherein said latch means is positioned on the side of the electrical part adjacent the side having the terminal leads.

4. A socket according to claim 1 wherein said linkage means comprises a cam member for contacting said reciprocating motion member and said contact element means.

5. A socket according to claim 1 wherein said means to cause said terminal leads to contact and wipe said contact element means comprises a member in the reciprocating motion member.

6. A socket according to claim 1 wherein said latch means has a holding portion and a contacting portion for controlling the movement of said latch means during the movement of said reciprocating motion member.

7. A socket according to claim 1 wherein said reciprocating motion member is a cover member movably attached to the socket body.

* * * * *